United States Patent
Wada et al.

(10) Patent No.: US 7,379,751 B2
(45) Date of Patent: May 27, 2008

(54) MULTI-BAND TRANSCEIVER AND RADIO COMMUNICATION DEVICE USING THE TRANSCEIVER

(75) Inventors: Toshiyuki Wada, Kumagaya (JP); Keisuke Fukamachi, Kumagaya (JP); Kenji Hayashi, Kumagaya (JP); Takashi Shiba, Yokosuka (JP); Norio Hosaka, Kamakura (JP); Makoto Katagishi, Chigasaki (JP)

(73) Assignees: Hitachi Metals, Ltd., Tokyo (JP); Hitachi Media Electronics Co., Ltd., Iwate (JP); Hitachi, Ltd., Tokyo (JP)

( * ) Notice: Subject to any disclaimer, the term of this patent is extended or adjusted under 35 U.S.C. 154(b) by 392 days.

(21) Appl. No.: 10/860,325

(22) Filed: Jun. 4, 2004

(65) Prior Publication Data
US 2005/0003855 A1    Jan. 6, 2005

(30) Foreign Application Priority Data
Jun. 4, 2003    (JP)    ............................. 2003-159744

(51) Int. Cl.
*H04B 1/18*    (2006.01)
(52) U.S. Cl. ............................. 455/552.1; 455/176.1; 361/777; 330/126; 333/132; 333/101
(58) Field of Classification Search ............. 455/553.1, 455/347, 333, 127.4, 74, 93, 552.1, 334, 455/341, 176.1; 330/124 R, 126; 333/132, 333/127, 101, 124, 129; 361/748, 777; *H04B 1/18*
See application file for complete search history.

(56) References Cited

U.S. PATENT DOCUMENTS

| | | | |
|---|---|---|---|
| 5,903,820 A * | 5/1999 | Hagstrom | ..................... 455/82 |
| 6,075,995 A * | 6/2000 | Jensen | ..................... 455/552.1 |
| 6,522,895 B1 * | 2/2003 | Montalvo | ................. 455/553.1 |
| 6,683,512 B2 * | 1/2004 | Nakamata et al. | .......... 333/126 |
| 6,745,046 B1 * | 6/2004 | Eckert et al. | ............. 455/552.1 |
| 6,900,700 B2 * | 5/2005 | Oosawa et al. | ................ 331/46 |
| 2002/0196085 A1 | 12/2002 | Nakamata et al. | |
| 2003/0003862 A1 * | 1/2003 | Yoshida et al. | ................ 455/25 |
| 2003/0017806 A1 * | 1/2003 | Sutono et al. | ................. 455/59 |
| 2004/0038660 A1 * | 2/2004 | He et al. | .................. 455/277.1 |
| 2004/0113719 A1 * | 6/2004 | Nakai et al. | ................. 333/133 |
| 2004/0178497 A1 * | 9/2004 | Takikawa et al. | ........... 257/728 |
| 2007/0028433 A1 * | 2/2007 | Abbott et al. | ............... 29/25.35 |

FOREIGN PATENT DOCUMENTS

JP    2003-046278    2/2003

* cited by examiner

*Primary Examiner*—Blane J. Jackson
(74) *Attorney, Agent, or Firm*—Antonelli, Terry, Stout & Kraus, LLP

(57) ABSTRACT

A multi-band transceiver has a function of sharing transmitted and received signals of multiple frequency bands by the same antenna. The multi-band transceiver mounts multiple filters that correspond to the multiple frequency bands and multiple amplifiers for amplifying the transmitted signals on the same substrate, and arranges the multiple filters in close vicinity to the amplifier in the order where the multiple filters are excellent in their temperature characteristic.

20 Claims, 10 Drawing Sheets

MULTI-BAND TRANSCEIVER AND RADIO COMMUNICATION DEVICE USING THE TRANSCEIVER

FIELD OF THE INVENTION

The present invention relates to a multi-band transceiver (transmitter-receiver) used in a front-end unit of a cellular phone or a radio communication device, and a radio communication device using the multi-band transceiver.

BACKGROUND OF THE INVENTION

In recent years, a cellular phone of a multi-band system that mounts transmitting-receiving systems of multiple communication systems in a single cellular phone, and can select them in accordance with regional characteristics and purposes for use is introduced. The cellular phone of the multi-band system must be provided with a transmitting-receiving circuit of each communication system and a branching circuit that branches a frequency band of the communication system. If each component is mounted individually, however, the cellular phone is made large, and leads to being increasingly expensive.

Concerning this type of problem, for example, a multi-band transceiver shown in Japanese Patent Laid-Open No. 2003-8470 (USP2002-196085) is disclosed. This multi-band transceiver integrates a branching circuit, a switching circuit that switches the transmitting-receiving circuit of each communication system, a power amplifier for amplifying a transmitted signal, and a coupler for monitoring the output of the power amplifier. The multi-band transceiver forms a matching circuit unit of the branching circuit, the switching circuit, the coupler, and the power amplifier in a dielectric substrate, and mounts diodes or elements of an amplifier circuit of the power amplifier on this substrate. Consequently, a high frequency circuit unit of the multi-band cellular phone is miniaturized and realizes cost reduction.

The multi-band cellular phone of JP-B No. 8470/2003, however, is limited to a communication system, such as a GSM (global system for mobile communications) or a DCS (digital cellular system) according to TDMA (time division multiple access), and cannot be used in the communication system including CDMA (code division multiple access). To realize a multi-band transceiver that can be used in the multi-band cellular phone including the CDMA, the switching circuit unit of the aforementioned multi-band transceiver can be replaced by an antenna shared device consisting of a matching circuit between a transmitting filter, a receiving filter, and a filter. Usually, a SAW filter is used here as the transmitting filter or the receiving filter.

SUMMARY OF THE INVENTION

A SAW filter is basically composed of a piezoelectric substrate and a IDT (Inter Digitated Transducer) electrode consisting of a conductor thin film formed on the surface of this substrate. A material having excellent characteristics is selected as the piezoelectric substrate. The piezoelectric substrate used practically as the SAW filter for a cellular phone has a temperature characteristic in the level of several ten ppm. Further, a thin film, such as Al or an Al alloy, is used as a conductor of the IDT (Inter Digitated Transducer) electrode. Because an antenna shared device according to the present invention handles relatively high power, the damage of a SAW filter causes a problem. The damage of this SAW filter occurs because the IDT electrode deteriorates due to a stress migration caused by the excitation and propagation of a surface acoustic wave, and the damage tends to be accelerated with temperature.

The aforementioned multi-band transceiver, however, mounts a semiconductor device for an amplifier circuit and a SAW filter on a mounting substrate. When a cellular phone is in a speech mode, the heat generated from the amplifier circuit is transferred to the SAW filter. As a result, the characteristic deterioration of the SAW filter occurs by the effects of heat. If a high output signal is input to the SAW filter in a high temperature state, a considerable reduction in reliability, such as the SAW filter is damaged easily, is predicted.

Further, as the technology that prevents the effects of temperature on the frequency characteristics of the SAW filter, there is a technology of improving a temperature characteristic by forming a material layer having the temperature characteristic that differs from a piezoelectric substrate material on the surface of a piezoelectric substrate or the surface of the piezoelectric substrate on which an electrode is formed.

For example, in a Y-cut X propagation tantalum oxide lithium single crystal (Y-X LiTaO3) used widely in a high frequency application, a frequency temperature coefficient is about −35 ppm. When ambient temperature rises, a frequency characteristic shifts to the low frequency side. For example, if a silicon dioxide ($SiO_2$) thin film is formed on the surface as a material having a rear temperature characteristic, it is known that mutual temperature characteristics are offset and a filter temperature characteristic is improved. In this case, the optimum value is selected to offset the temperature characteristic concerning the film thickness of $SiO_2$, and, normally, the film thickness of several percent to several ten percent of a SAW wavelength excited by a filter electrode is used.

Because a thin film for temperature characteristic compensation is additionally formed on the surface by the aforementioned temperature characteristic improving means, the thickness of this thin film affects the excitation or propagation characteristic of the SAW filter. Accordingly, because the film thickness cannot be controlled satisfactorily by the present technology, characteristic dispersion is caused.

Because the characteristic dispersion resulting in such type of process becomes a big problem on the mass production of a SAW filter, an improving means that does not depend on the aforementioned thin film formation is strongly desired to suppress the effects of heat and realize more stable performance in a transceiver that uses the SAW filter.

The present invention solves the aforementioned problems, and an object is to prevent the performance deterioration of the entirety of a multi-band transceiver due to the generation of heat from a semiconductor device for an amplifier circuit.

A further object is to provide a compact, low-cost, and high-reliability multi-band transceiver.

The multi-band transceiver of the present invention has a function of sharing transmitted and received signals of multiple frequency bands by the same antenna. The multi-band transceiver mounts multiple filters that correspond to the multiple frequency bands and multiple amplifiers for amplifying the transmitted signals on the same substrate, and arranges the multiple filters in close vicinity to the amplifier in the order where the multiple filters are excellent in their temperature characteristic.

The multi-band transceiver of the present invention has the function of sharing transmitted and received signals of multiple frequency bands by the same antenna. The multi-band transceiver mounts multiple filters that correspond to the multiple frequency bands and multiple amplifiers for amplifying the transmitted signals on the same substrate, and arranges the multiple filters in close vicinity to the amplifier in the order where the filter excellent in its temperature characteristic is preferentially arranged. At the same time, the multi-band transceiver arranges at least one other amplifier between a filter arranged in closest vicinity to the amplifier and an amplifier that operates in a frequency band corresponding to this filter.

The multi-band transceiver of the present invention is provided with a first shared device for performing the transmission and reception of a first communication system, a second shared device for performing the transmission and reception of a second communication system, a first amplifier for amplifying the transmitted signal of the first communication system, a second amplifier for amplifying the transmitted signal of the second communication system, and a frequency switching circuit for switching frequency bands of the first and second communication systems. The multi-band transceiver mounts a first transmitting filter that constitutes the first shared device, a first receiving filter that forms the first shared device, a second transmitting filter that constitutes the second shared device, a second receiving filter that forms the second shared device, the first amplifier, and the second amplifier on the same substrate. In multi-band transceiver the distance between the first transmitting filter or the first receiving filter and the first amplifier or the second amplifier is made larger than the distance between the second transmitting filter or the second receiving filter and the first amplifier or the second amplifier.

The multi-band transceiver of the present invention is provided with a first shared device for performing the transmission and reception of a first communication system, a second shared device for performing the transmission and reception of a second communication system, a first amplifier for amplifying the transmitted signal of the first communication system, a second amplifier for amplifying the transmitted signal of the second communication system, and a frequency switching circuit for switching frequency bands of the first and second communication systems. The multi-band transceiver mounts a first transmitting filter that constitutes the first shared device, a first receiving filter that forms the first shared device, a second transmitting filter that constitutes the second shared device, a second receiving filter that forms the second shared device, the first amplifier, and the second amplifier on the same substrate. In the multi-band transceiver, the distance between the first transmitting filter or the first receiving filter and the first amplifier or the second amplifier is made larger than the distance between the second transmitting filter or the second receiving filter and the first amplifier or the second amplifier. In addition, the second transmitting filter and the second receiving filter are arranged between the first transmitting filter/the first receiving filter and the first amplifier/the second amplifier.

Desirably, in the multi-band transceiver of the present invention each of the multiple filters is formed through a different process and has a different temperature characteristic.

Further, desirably, in the multi-band transceiver of the present invention a filter located farther from the amplifier corresponds to a communication system of a lower frequency within the multiple frequency bands.

Desirably, in the multi-band transceiver a matching circuit for obtaining the matching between the transmitting and receiving filters that correspond to each frequency band, at least a part of the matching circuits of the amplifier, and a part of the frequency switching circuits for switching the frequency band are arranged on the surface or inside of the substrate.

Desirably, in the multi-band transceiver of the present invention an electrode pattern leading into a ground electrode via a through hole between the amplifier and the filter arranged in close vicinity and/or between the filter arranged in close vicinity and another filter is formed on a dielectric layer that constitutes the substrate.

Further, in the multi-band transceiver a recessed part for housing at least one of the transmitting filter, the receiving filter, and the amplifier can be provided on at least either the surface or rear of the substrate.

Desirably, in the multi-band transceiver of the present invention the substrate is formed with either a ceramics or resin substrate.

Desirably, in the multi-band transceiver of the present invention the ceramics is Low Temperature Co-fired Ceramics (LTCC).

Desirably, in the multi-transceiver of the present invention the substrate is a composite material of resin and ceramics.

In a radio communication device of the present invention having a transmission and reception function in multiple frequency bands, the multi-band transceiver of the present invention is arranged between an antenna and multiple high frequency circuits that correspond to the multiple frequency bands. The radio communication device is provided with a control unit that controls operation conditions of the high frequency circuit and the multi-band transceiver in accordance with the frequency band used in communication.

In the radio communication device of the present invention having a transmission and reception function in multiple frequency bands, the multi-band transceiver of the present invention between an antenna and multiple high frequency circuits that correspond to the multiple frequency bands is arranged. The radio communication device is provided with a control unit that controls operation conditions of the high frequency circuit and the multi-band transceiver in accordance with the frequency band used in communication. When the radio communication device performs communication in the frequency band that corresponds to the filter arranged in closest vicinity to the amplifier, the control unit controls the processing so that the amplifier other than the amplifier that is closest to the filter arranged in closest vicinity can be operated.

DETAILED DESCRIPTION OF THE PREFERRED EMBODIMENTS

First Embodiment

A first embodiment according to the present invention is shown in FIGS. 1 to 6.

Figure 1:
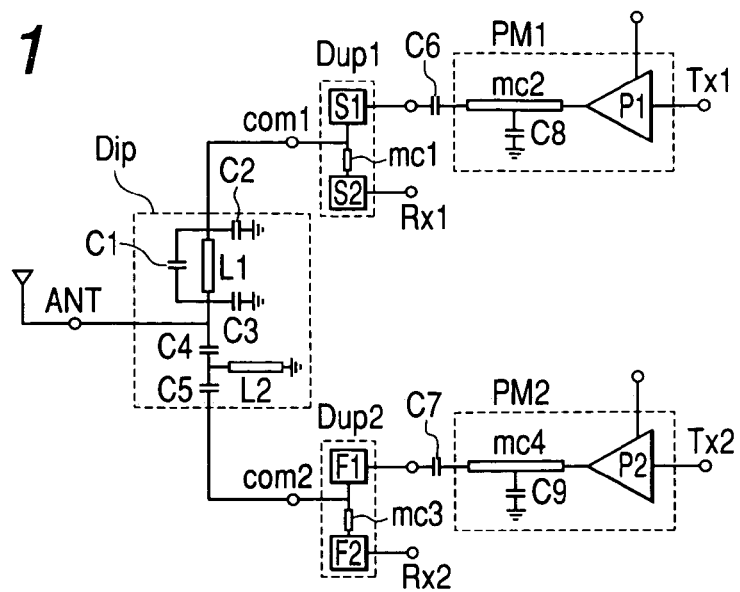
FIG. 1 shows a circuit diagram of a multi-band transceiver of the present invention.
Figure 2:
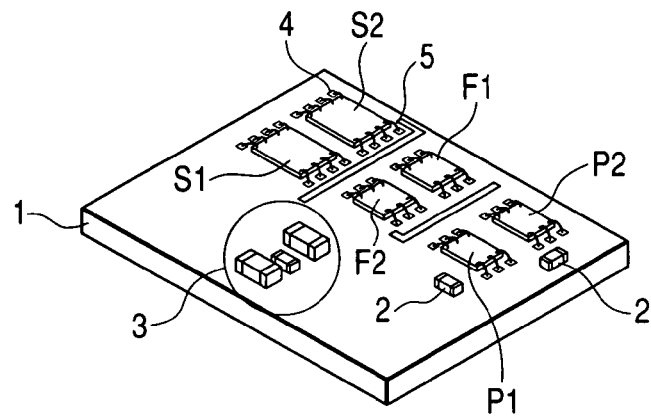
FIG. 2 is a perspective view of a first embodiment of the multi-band transceiver of the present invention.
Figure 3:
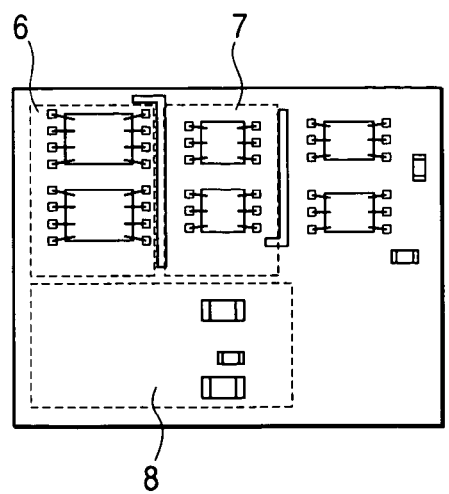
FIG. 3 is a top view of the multi-band transceiver of the first embodiment.
Figure 4:
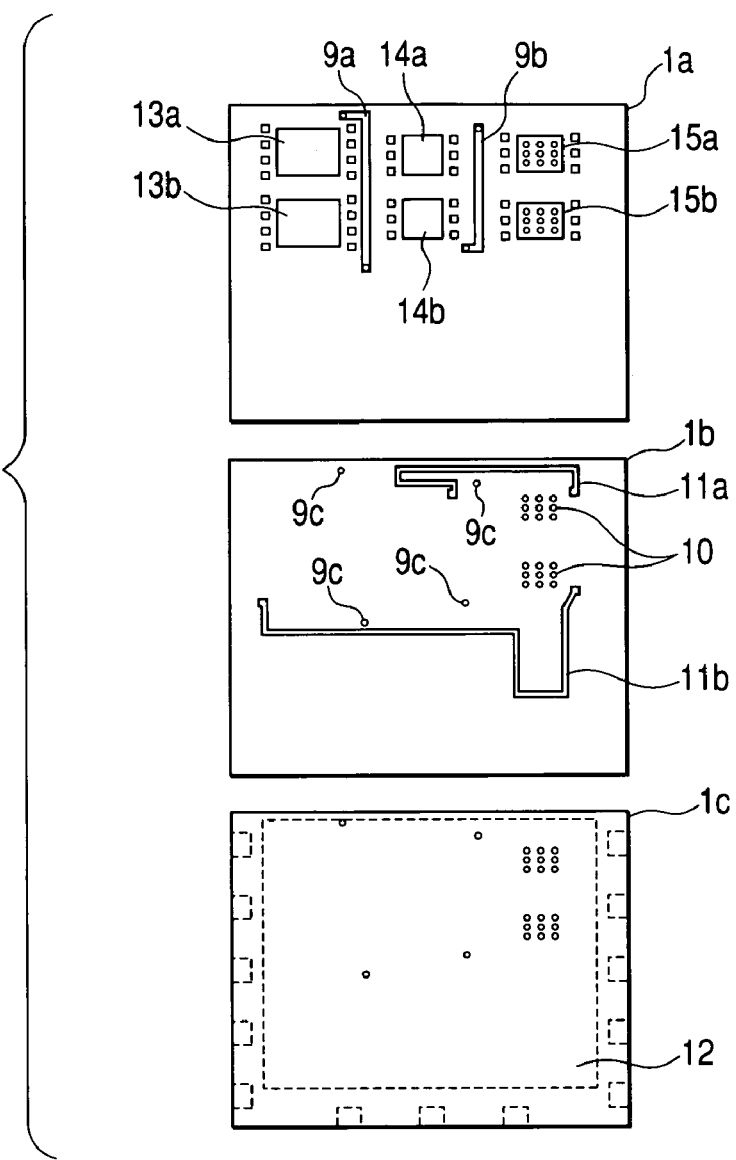
FIG. 4 is an exploded view of a dielectric sheet that constitutes a substrate on which the multi-band transceiver of the first embodiment is mounted.
Figure 5:
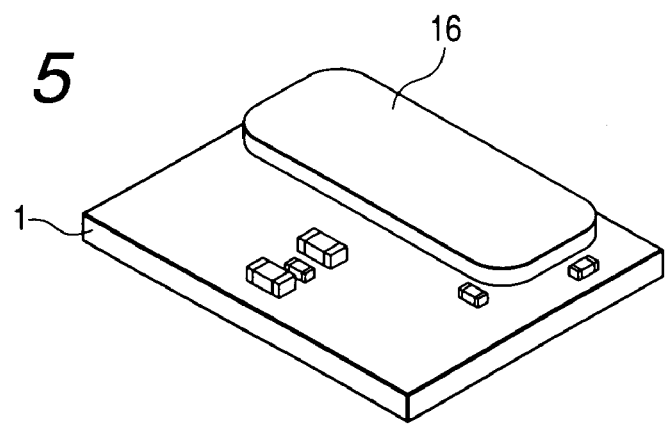
FIG. 5 is a perspective view of the multi-band transceiver of the first embodiment after it is sealed with resin.
Figure 6:
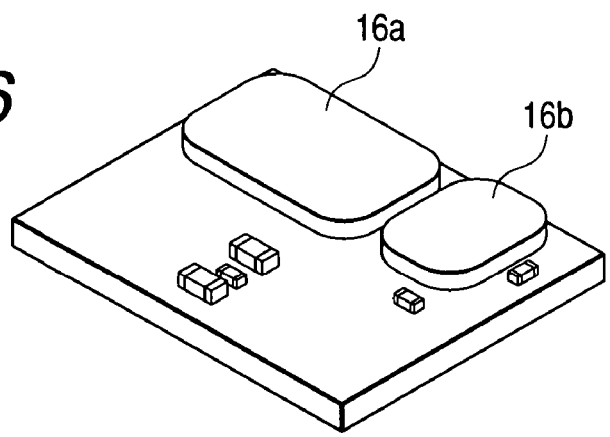
FIG. 6 is a drawing showing another method of sealing with resin of the first embodiment.

FIG. 1 is a circuit diagram of a multi-band transceiver, and FIG. 2 is a perspective view of this embodiment. FIG. 3 is a top view of this embodiment. FIG. 4 is an exploded view of a dielectric sheet that comprises a mounting substrate of this embodiment. FIGS. 5 and 6 are perspective views of this embodiment.

(Circuit Configuration)

The multi-band transceiver of this embodiment, as shown in FIG. 1, is provided with a branching filter Dip that is a frequency switching circuit, an antenna shared device Dup1 of a first communication system, a first amplifier PM1 for amplifying a transmitted signal of the first communication system, an antenna shared device Dup2 of a second communication system, and a second amplifier PM2 for amplifying the transmitted signal of the second communication system. The branching filter Dip connects a low-pass filter consisting of capacitors C1, C2, and C3 and an inductor L1 between an ANT terminal and a common terminal com1 of the shared device Dup1, and connects a high-pass filter consisting of capacitors C4 and C5 and an inductor L2 between the ANT terminal and a common terminal com2 of Dup2. In this embodiment, the communication frequency band of the first communication system is separated from the communication frequency band of the second communication system by about 1,000 MHz, and the first communication system uses a band on the low frequency side and the second communication system uses a band on the high frequency side. The Dup1 consists of two filters S1 and S2 and a matching circuit mc1 and the Dup2 consists of two filters F1 and F2 and a matching circuit mc3. Further, the PM1 consists of an amplifier circuit P1, a matching circuit mc2, and a capacitor C8. The PM2 consists of an amplifier circuit P2, a matching circuit mc4, and a capacitor C9. In this embodiment, the S1 and S2 are the SAW filters and the F1 and F2 are the FBAR filters.

When the first communication system is utilized, a transmitted signal input from a transmitting terminal Tx1 is amplified in the amplifier circuit P1 of the amplifier PM1 and input to the filter S1 of the Dup1. The matching circuit mc2 and the C8 of the PM1 are circuits for obtaining the impedance matching between the P1 and the filter S1 of the Dup1, and transferring the transmitted signal amplified by the P1 to the S1 effectively. A capacitor C6 cuts a direct current from the amplifier PM1. The S1 transfers a signal to a branching filter with a low loss. At this occasion, the impedance of the filter S2 viewed from the filter S1 reaches high impedance due to the effects of the matching circuit mc1, and the transmitted signal is not leaked to a receiving terminal Rx1. The transmitted signal input from the Dup1 to the branching filter Dip is output to the ANT terminal and is radiated from an antenna to the air. At this occasion, the high-pass filter of the branching filter Dip attenuates a transmitted signal. Accordingly, the leakage of the signal into the circuit on the second communication system side is reduced, and a wrong operation of a cellular phone can be prevented.

Conversely, a received signal received from an antenna is input from the ANT terminal to the branching filter Dip. The received signal is input from the low pass filter of the branching filter Dip to the filter S2 via the matching circuit mc1 of the Dup1. The S2 transfers the signal to the receiving terminal Rx1 with a low loss. At this occasion, the impedance of the S1 viewed from the S2 reaches exceedingly high impedance, and the received signal is not leaked to the amplifier PM1.

When the second communication system is utilized, the transmitted signal input from a transmitting terminal Tx2 is amplified in the amplifier circuit P2 of the amplifier PM2 and input to the filter F1 of the Dup2. The matching circuit mc4 and C9 of the PM2 are circuits for obtaining the impedance matching between the P2 and the filter F1 of the Dup2 and transferring the transmitted signal amplified by the P2 to the F1 effectively. A capacitor C7 cuts a direct current from the amplifier PM2. The F1 transfers a signal to a branching filter with a low loss. At this occasion, the impedance of the filter F2 viewed from the filter F1 reaches exceedingly high impedance due to the effects of the matching circuit mc3 of the Dup2, and the transmitted signal is not leaked into a receiving terminal Rx2. The transmitted signal input from the Dup2 to the branching filter Dip is output to the ANT terminal and is radiated from an antenna to the air. At this occasion, the low-pass filter of the branching filter Dip attenuates the transmitted signal. Accordingly, the leakage of the signal into the circuit on the first communication side is reduced, and a wrong operation of a cellular phone can be prevented.

On the other hand, the received signal received from the antenna is input from the ANT terminal to the branching filter Dip. The received signal is input from the high-pass filter of the branching filter Dip to the filter F2 via the matching circuit mc3 of the Dup2. The F2 transfers the signal to the receiving terminal Rx2 with a low loss. At this occasion, the impedance of the F1 viewed from the F2 reaches high impedance, and the received signal is not leaked to the amplifier PM2.

(Filter Arrangement)

FIG. 2 shows a perspective view of this embodiment. The multi-band transceiver of this embodiment mounts the filters F1 and F2 of the Dup1, the filters F1 and F2 of the Dup2, the amplifier circuit P1 of the amplifier PM1, the amplifier circuit P2 of the amplifier PM2, a chip element 2 that forms the direct current cut capacitors C6 and C7 of the amplifier, and a chip element 3 that forms the capacitors C4, C5, and C6 and the inductor L1 on the top of the mounting substrate 1. In this embodiment, the FBAR filters F1 and F2 excellent in a thermal characteristic in comparison with the SAW filter are arranged between the amplifier circuits P1/P2 and the SAW filters S1/S2. Each of the filters and amplifier circuits adheres on the mounting substrate with an adhesive material. Further, an electrode 4 is arranged around each of the filters and amplifiers, and a wire 5 connects an input-output electrode or ground electrode of the filter with the electrode 4. Accordingly, each of the filters and amplifier circuits connects with the circuit inside the mounting substrate.

This arrangement method becomes difficult to transfer the heat generated from the P1 and P2 to the SAW filters S1 and S2 because the FBAR filters F1 and F2 are arranged halfway. Accordingly, even if the SAW filter is used for a long time, the damage of the SAW filter due to the characteristic deterioration of the SAW filter and the deterioration in the power resistance of the SAW filter under high temperature is reduced greatly. Conversely, the FBAR filter arranges a film composed of a piezoelectric substance, such as AlN or ZnO, between flat thin film electrodes composed of a conductive material, such as Al, and utilizes the vibration of this piezoelectric film. Accordingly, the FBAR filter is more excellent than the SAW filter that forms a micro cord thin film electrode on a piezoelectric substrate, in the power resistance at high temperature. Accordingly, even if a high output signal is input from an amplifier, the FBAR filter is not damaged.

FIG. 3 is a top view of this embodiment. The matching circuits mc1 and mc3 of an antenna shared device, a part of the matching circuits mc2 and mc4 of an amplifier, and a part of the branching filters Dips are formed inside the mounting substrate 1. Multiple dielectric sheets are laminated on the mounting substrate 1. The mc1, mc2, mc3, mc4, and L2 are formed on these dielectric sheets as strip line electrodes, and the C1, C2, and C3 are formed as opposed flat electrodes extending over the multiple dielectric sheets. In this embodiment, the mc1 is formed in an area 6 enclosed by a dashed line, and the mc3 is formed in an area 7 enclosed by a dashed line. A part of the branching filter circuits L2, C1, C2, and C3 is formed in an area 8 enclosed by a dashed line.

(Laminated Structure)

FIG. 4 is an exploded view of a dielectric sheet that comprises a mounting substrate of this embodiment. Electrodes 9a, 9b, 13a, 13b, 14a, 14b, 15a, and 15b are formed on the top of a dielectric sheet 1a. The electrodes 13a and 13b mount the SAW filters S2 and S1 respectively. The electrodes 14a and 14b mount the FBAR filters F1 and F2 respectively. The electrodes 15a and 15b mount the amplifier circuits P2 and P1 respectively. A ground electrode 12 formed on the bottom of a dielectric sheet 1c connects with the electrodes 15a and 15b via a through hole 10. Accordingly, a part of the heat generated from the amplifier circuit can escape from a reverse ground electrode 12 to a motherboard of a cellular phone via the through hole 10. The electrodes 9a and 9b connect with a through hole 9c formed on a dielectric sheet 1b and the dielectric sheet 1c. The through hole 9c connects with the ground electrode 12. Accordingly, the heat generated from the amplifier circuit can escape from the reverse ground electrode 12 to the motherboard of the cellular phone via the through hole, and the amount of heat transfer into a filter can be reduced. In particular, because the two electrodes 9a and 9b are arranged between the SAW filters S1/S2 and the amplifier circuit, a higher effect can be obtained.

Electrodes 11a and 11b formed on the top of the dielectric sheet 1b are strip line electrodes on which the matching circuits mc4 and mc2 are formed. Generally, a first communication system having a low communication frequency requires a matching circuit electrode of a longer amplifier than a second communication system having a high communication frequency. According to a filter arrangement method of this embodiment, the distance between the SAW filter and the amplifier circuit of the first communication system becomes larger than the distance of the FBAR filter and the amplifier circuit of the second communication system. Accordingly, a strip line electrode of the long matching circuit mc2 can be formed efficiently.

(Sealed Structure)

FIG. 5 shows a perspective view of this embodiment. After a filter, an amplifier circuit, and a chip element are mounted on the top of the mounting substrate 1, the SAW filters S1 and S2, the FBAR filters F1 and F2, and the amplifier circuit P1 and P2 are hermetically sealed by a resin material 16. Accordingly, each filter or amplifier circuit can be protected from the damage by a contact or deterioration by exposure to the air.

FIG. 6 is a drawing showing another hermetic seal method of this embodiment. The SAW filters S1 and S2 and the FBAR filters F1 and F2, and the amplifier circuits P1 and P2 are hermetically sealed with resin materials 16a and 16b respectively. This method reduces the amount of heat transferred from an amplifier circuit to a SAW filter via a resin material. Accordingly, the characteristic deterioration due to the heat of the SAW filter is reduced further, and a higher reliability multi-band transceiver can be realized.

(Modification Example)

Figure 7:
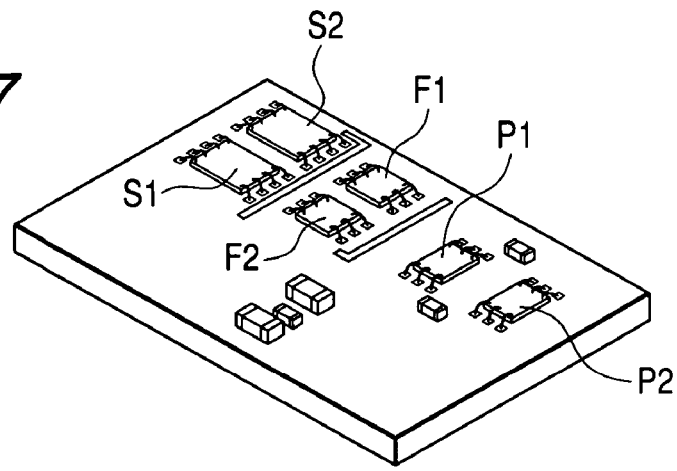
FIG. 7 is a perspective view showing a modification example of the first embodiment of the multi-band transceiver of the present invention.

FIG. 7 is a modification example of a mounting method of this embodiment. In this example, the amplifier circuit P1 is arranged adjacently to the FBAR filters F1 and F2, but the amplifier circuit P2 is arranged between the FBAR filters F1 and F2 via the amplifier circuit P1. In this case, when a first communication system is operating, the FBAR filters F1 and F2 are inserted between the amplifier circuit P1 and the SAW filters S1/S2. Accordingly, the transfer of the heat from the amplifier P1 to the SAW filter S1 and S2 can be reduced.

Conversely, when a second communication system is operating, the amplifier circuit P1 is inserted between the amplifier circuit P2 and the FBAR filters F1/F2. Accordingly, the transfer of the heat from the amplifier circuit P2 to the FBAR filters F1 and F2 can be reduced. This arrangement method can increase the distance between the filter and the amplifier circuit that correspond to each communication system, and insert a filter or an amplifier circuit of another communication system between the filter and the amplifier circuit. Accordingly, even if which communication system is used, a multi-band transceiver that operates stably can be realized.

Second Embodiment

Figure 8:
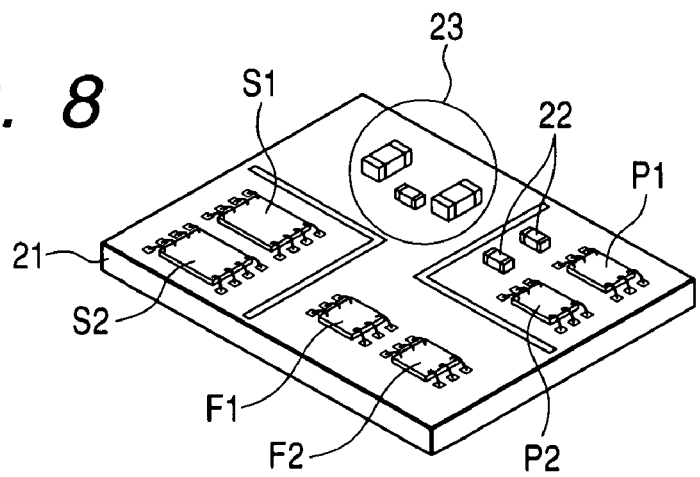
FIG. 8 is a perspective view of a second embodiment of the multi-band transceiver of the present invention.
Figure 9:
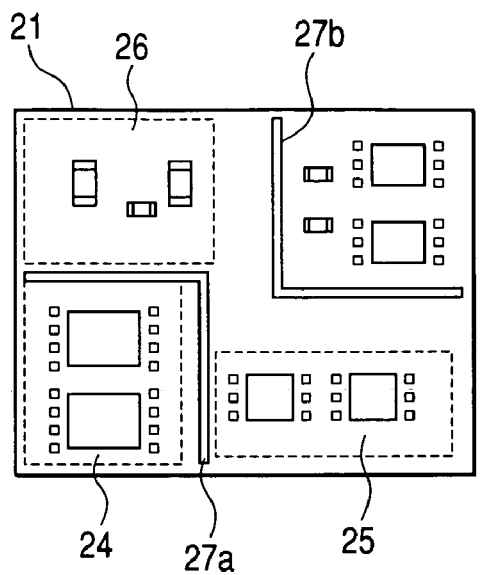
FIG. 9 is a top view of the multi-band transceiver of the second embodiment.
Figure 10:
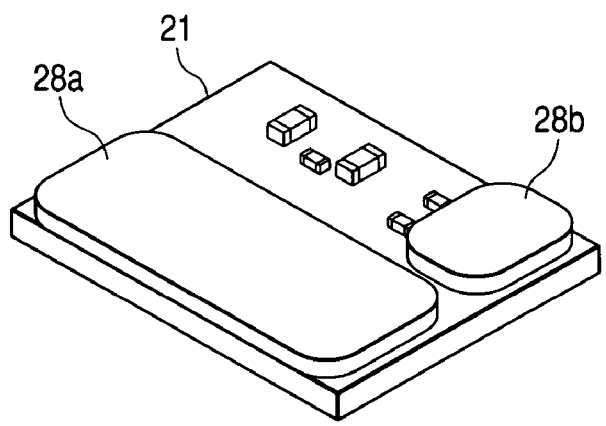
FIG. 10 is a perspective view of the multi-band transceiver of the second embodiment after it is sealed with the resin.

Next, a second embodiment according to the present invention is shown in FIGS. 8 to 10. FIG. 8 is a perspective view of this embodiment. FIG. 9 is a top view of this embodiment. FIG. 10 is a perspective view of this embodiment.

In this embodiment, as shown in FIG. 8, the filters S1 and S2 of the Dup1, the filters F1 and F2 of the Dup2, the amplifier circuit P1 of the amplifier PM 1, the amplifier circuit P 2 of the amplifier PM 2, a chip element 22 that forms a part of the matching circuits mc2 and mc4 of the amplifier, and a chip element 23 that forms a part of branching filters Dips on the top of a mounting substrate 21 are mounted. In this embodiment, the amplifier circuits P1 and P2 and the SAW filters S1 and S2 are arranged on a diagonal line on the top of the mounting substrate 21, and the FBAR filters F1 and F2 are arranged in the traverse part between them. This arrangement method can arrange the FBAR filters F1 and F2 between the amplifier circuits P1/P2 and the SAW filters S1/S2, and increase the distance between the P1/P2 and the S1/S2. Accordingly, the transfer of the heat generated from the amplifier circuit into the SAW filter can be reduced.

FIG. 9 shows a top view of the second embodiment. The matching circuits mc1 and mc3 of an antenna shared device, a part of the matching circuits mc2 and mc4 of an amplifier, and a part of branching filters Dips are formed inside the mounting substrate 21. Multiple dielectric sheets are laminated on the mounting substrate 21. The mc1, mc2, mc3, mc4, and L2 are formed on these dielectric sheets as strip line electrodes. C1, C2, and C3 are formed and incorporated as opposed flat electrodes extending over multiple dielectrics. In this embodiment, the mc1 is formed at a lower layer into which an area 24 enclosed by a dashed line is projected, and the mc3 is formed at the lower layer of an area 25 enclosed by a dashed line. Further, a part of the branching filters L2, C1, C2, and C3 is formed at the lower layer of an area 26 enclosed by a dashed line. Through holes 27a and 27b connect with the reverse ground electrode via a through hole, and the heat generated from the amplifier circuit escapes into a motherboard of a cellular phone via the through hole. Accordingly, the transfer of the heat into the SAW and FBAR filters can be reduced. Further, although not shown, multiple through holes are formed from the P1 or P2 mounting unit to the reverse ground electrode in the same manner as the first embodiment. Accordingly, a part of the heat generated from the amplifier circuit can be transferred into the motherboard of the cellular phone.

FIG. 10 is a perspective view of this embodiment. After a filter, an amplifier circuit, and a chip element are mounted on the top of the mounting substrate 21, the SAW filters S1 and S2 and the FBAR filters F1 and F2 are hermetically sealed with a resin material 28a, and the amplifiers P1 and P2 are hermetically sealed with a resin material 28b. Accordingly, each filter and amplifier circuit can be protected from the damage due to a contact and the deterioration due to exposure to the air. Further, because the amplifier circuit and filter are sealed with another resin material respectively, the transfer of the heat from the amplifier circuit to the SAW filter via the resin material is reduced. Accordingly, the reliability of a multi-band transceiver is improved further.

Third Embodiment

Figure 11:
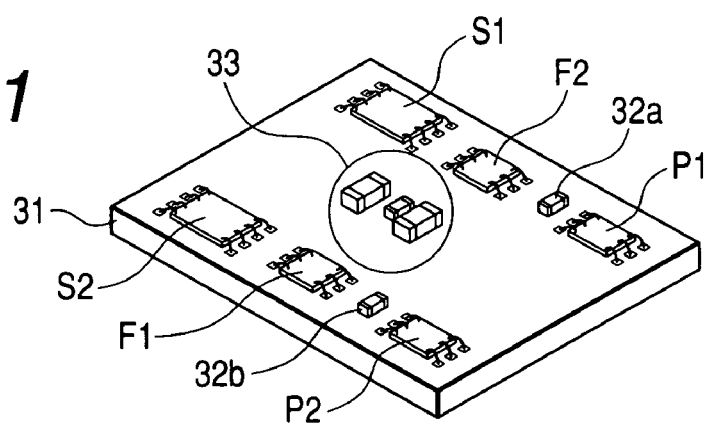
FIG. 11 is a perspective view of a third embodiment of the multi-band transceiver of the present invention.
Figure 12:
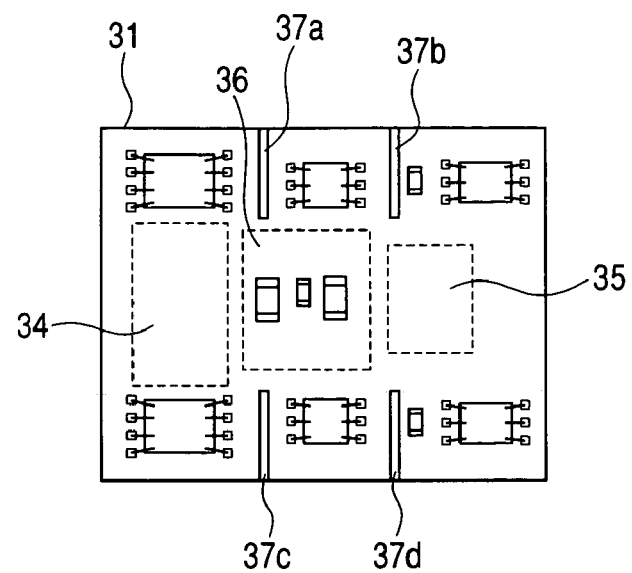
FIG. 12 is a top view of the multi-band transceiver of the third embodiment.
Figure 13:
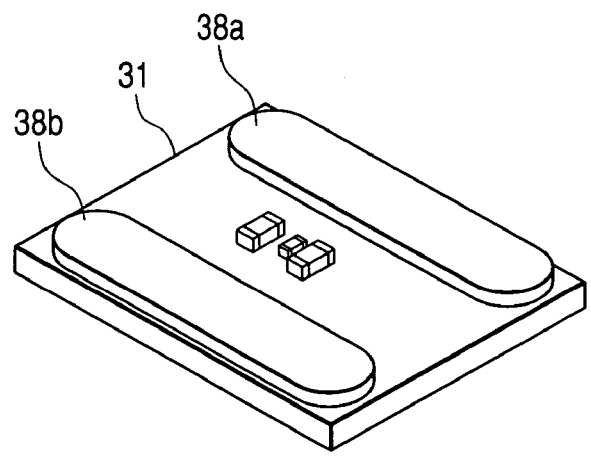
FIG. 13 is a perspective view of the multi-band transceiver of the third embodiment after it is sealed with the resin.

Next, a third embodiment according to this embodiment is shown in FIGS. 11 to 13. FIG. 11 is a perspective view of this embodiment. FIG. 12 is a top view of this embodiment, and FIG. 13 is a perspective view of this embodiment. In this embodiment, as shown in FIG. 11, the filters S1 and S2 of the Dup1, the filters F1 and F2 of the Dup2, the amplifier circuit P1 of the amplifier PM1, the amplifier circuit P2 of the amplifier PM 2, chip elements 32a and 32b that form the matching circuits mc2 and mc4 of the amplifier, and a chip element 33 that forms a part of the branching filters Dips on the top of a mounting substrate 31. In this embodiment, the amplifier circuit P1, the FBAR filter F2, and the SAW filter S1 are arranged at one side on the top of the mounting substrate 31 in columns, and the amplifier circuit P2, the FBAR filter F1, and the SAW filter S1 are arranged at the other side on the top of the mounting substrate 31 in columns, then the chip element 33 is arranged in the central part of the mounting substrate in columns. Subsequently, each column arranges an FBAR filter between an amplifier circuit and a SAW filter. This arrangement method can increase the distance between the SAW filters S1/S2 and the FBAR filters F1/F2. Accordingly, the interference generated by arranging a filter element in close vicinity decreases, and the isolation characteristic of each antenna shared device is improved from a transmitting terminal to a receiving terminal. Further, because the amplifier circuit P1 or the SAW filter S1 and the amplifier circuit P2 or the FBAR filter F1 are arranged in the same column, the matching circuits mc2 or mc4 of the amplifier circuit can be arranged efficiently.

FIG. 12 is a top view of this embodiment. In the same manner as the aforementioned embodiment, a part of the matching circuits mc1 to mc4 and a part of branching filter circuits are formed inside the mounting substrate 31. In this embodiment, the matching circuit mc1, the matching circuit mc3, and a part of the branching filter circuits are formed in an area 34 enclosed by a dashed line, in an area 35, and in an area 36, inside a dielectric sheet, respectively. An electrode 37 is connected to the reverse ground electrode via a through hole, and a part of the heat generated from an amplifier circuit escapes from the reverse ground electrode via the through hole to a motherboard of a cellular phone. Accordingly, the transfer of heat into a filter can be reduced.

FIG. 13 shows a perspective view of this embodiment. In this embodiment, the amplifier circuit P1, the SAW filter S1, the FBAR filter F2, and the chip element 32a are hermetically sealed with a resin material 38a, and the amplifier circuit P2, the SAW filter S2, the FBAR filter F1, and the chip element 32b are hermetically sealed with a resin material 38b respectively. Accordingly, a filter or an amplifier circuit is protected from being damaged by a contact and deteriorating by being exposed to the air.

Fourth Embodiment

Figure 14:
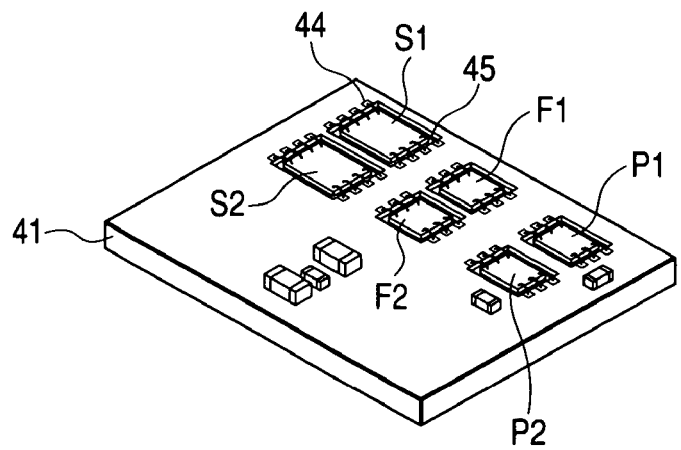
FIG. 14 is a perspective view of a fourth embodiment of the multi-band transceiver of the present invention.

Next, a fourth embodiment according to this embodiment is shown in FIG. 14. FIG. 14 is a perspective view of this embodiment. The structure of this embodiment is the same as the first embodiment. A recessed part is provided on the top of a mounting substrate 41, and the filters S1, S2, F1, and F2 and the amplifier circuits P1 and P2 are housed here. Each recessed part of the mounting substrate 41 has almost the same thickness of the filter or amplifier circuit to be housed, and the height on the top of the filter or amplifier circuit becomes almost the same height as the top of the mounting substrate when housed. Further, an electrode 44 is arranged around the recessed part and a wire 45 connects between the electrode 44 and a connecting terminal provided on the top of the filter or amplifier circuit. At this occasion, because the electrode 44 and the connecting terminal of the filter or amplifier circuit are located at almost the same height, the wire can be connected easily. Further, when the filter or amplifier circuit is hermetically sealed with the same resin material as the first embodiment, the thickness of the resin material can be thinned because the filter or amplifier circuit is housed in the recessed part. Accordingly, a low multi-band transceiver can be realized.

Fifth Embodiment

Figure 15:
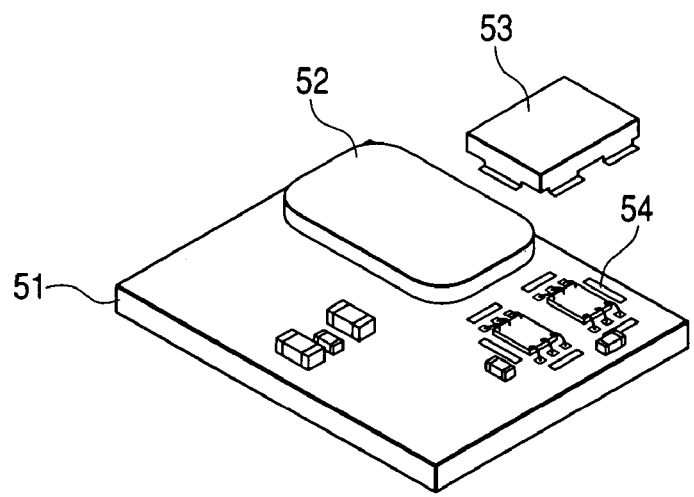
FIG. 15 is a perspective view of a fifth embodiment of the multi-band transceiver of the present invention.
Figure 16:
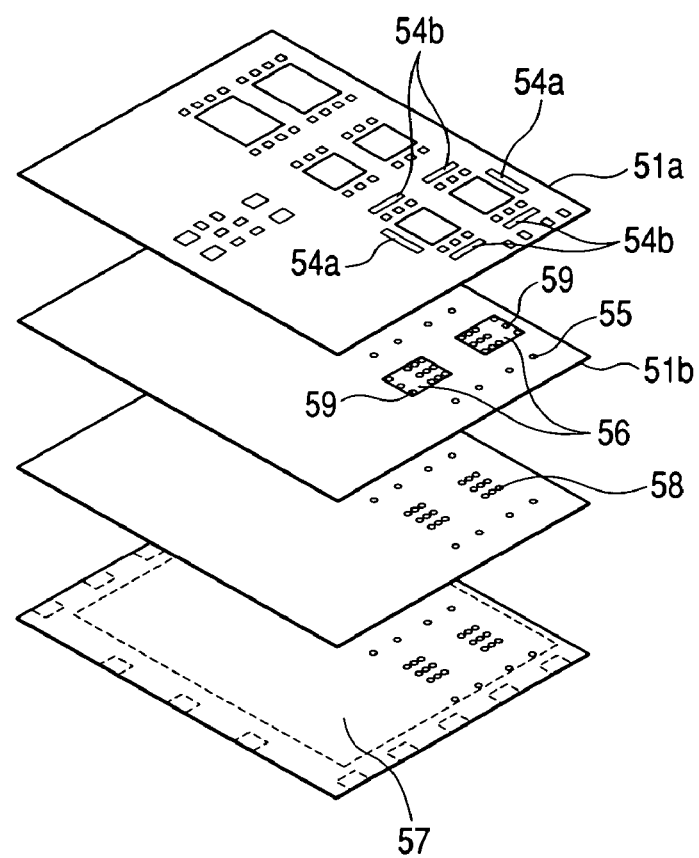
FIG. 16 is an exploded perspective view of the dielectric sheet that constitutes a mounting substrate of the fifth embodiment.

Subsequently, a fifth embodiment according to this embodiment is shown in FIGS. 15 and 16. FIG. 15 shows a perspective view of this embodiment, and FIG. 16 shows an exploded perspective view of the mounting substrate. This embodiment is a modification example of a seal method of the first embodiment. A resin material 52 hermetically seals only the SAW filters S1 and S2 and the FBAR filters F1 and F2. A metal cover 53 hermetically seals the amplifier circuits P1 and P2 by connecting an electrode 54, provided on the top of a mounting substrate 51, with a conductive adhesive material and sticking to the mounting substrate 51.

FIG. 16 is an exploded perspective view of the mounting substrate of this embodiment. An electrode 54a provided on the top of a dielectric sheet 51a connects with an electrode 56 formed on a dielectric sheet 51b via a through hole 59. The electrode 56 connects with a through hole 58 formed from an amplifier circuit mounting unit to a reverse ground electrode 57. The electrode 54a connects with the reverse ground electrode 57 via a through hole 55. Accordingly, the heat generated from the amplifier circuits P1 or P2 and transferred to the metal cover 53 can escape into a motherboard of a cellular phone via the through holes 55 and 58. Accordingly, the amount of the heat transferred to the SAW and FBAR filters is reduced, and the characteristic deterioration due to the heat of the SAW filter is reduced further. Consequently, a higher reliability multi-band transceiver can be realized.

Sixth Embodiment (Circuit Configuration)

Figure 17:
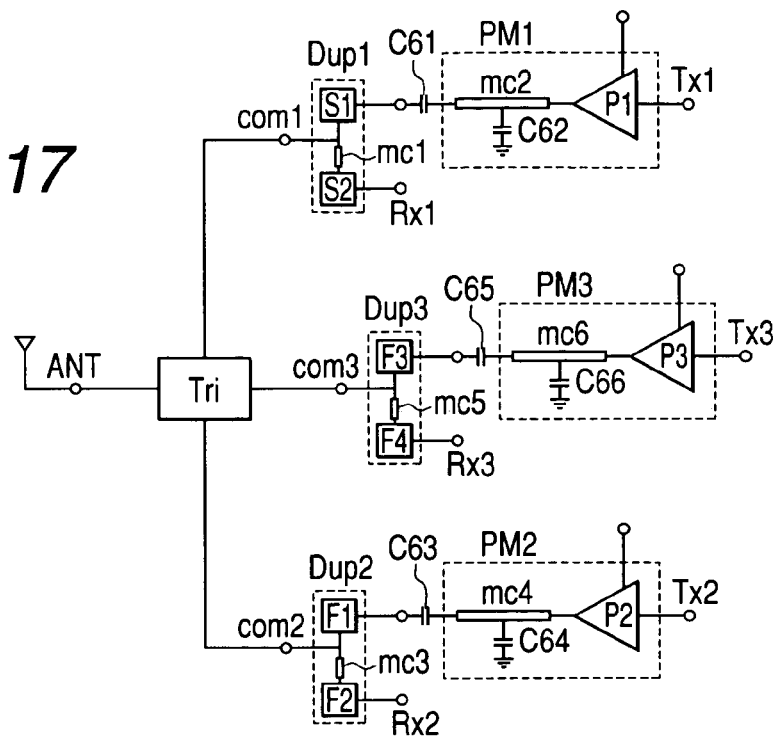
FIG. 17 is a circuit diagram of a sixth embodiment of the multi-band transceiver of the present invention.
Figure 18:
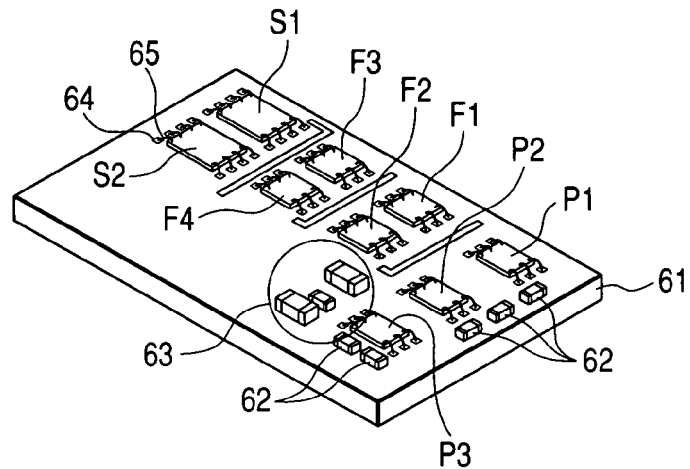
FIG. 18 is a perspective view of the multi-band transceiver of the sixth embodiment.
Figure 19:
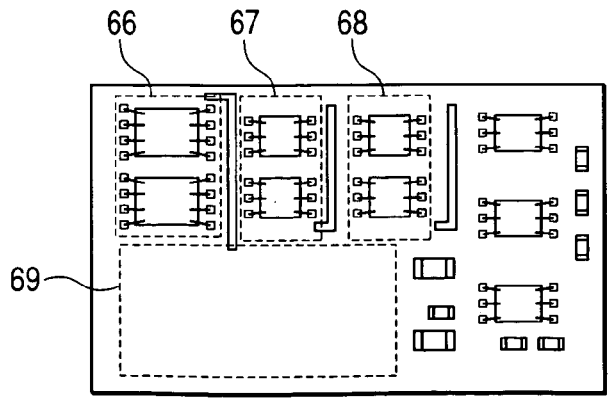
FIG. 19 is a top view of the multi-band transceiver of the sixth embodiment.
Figure 20:
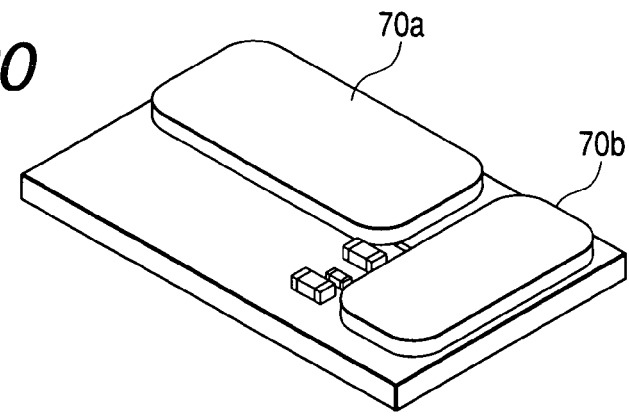
FIG. 20 is a perspective view of the multi-band transceiver of the sixth embodiment after it is sealed with the resin.

Next, a sixth embodiment according to this embodiment is shown in FIGS. 17 to 20. FIG. 17 is a circuit diagram of this embodiment, and FIG. 18 is its perspective diagram. FIG. 19 is a top view of this embodiment, and FIG. 20 is a perspective view of this embodiment. In this embodiment, a multi-band transceiver can be utilized in three different communication systems. As shown in FIG. 17, a triplexer Tri that is composed of a passive circuit and switches the frequencies of the three communication systems is arranged immediately under an antenna. The antenna shared device Dup1 of a first communication system, the antenna shared device Dup2 of a second communication system, the antenna shared device Dup3 of a third communication system, the amplifier PM1 for amplifying a transmitted signal of the first communication system, the amplifier PM2 for amplifying the transmitted signal of the second system, and the amplifier PM3 for amplifying the transmitted signal of the third communication system are connected to the rear stage. The Dup1 is provided with the two filters S1 and S2 and the matching circuit mc1, and the Dup2 is provided with the two filters F1 and F2 and the matching circuit mc3. The Dup3 is provided with the two filters F3 and F4 and the matching circuit mc5. Further, the PM1 is provided with the amplifier circuit P1, the matching circuit mc2, and a C62, and the PM2 is provided with the amplifier circuit P2, the matching circuit mc4, and a C64. The PM3 is provided with the amplifier circuit P3, a matching circuit mc6, and a C66. In this embodiment, the communication frequency bands of each communication system are separated by 1,000 MHz or more respectively. The first communication system utilizes the lowest band, and the third communication system utilizes the highest frequency band. The second communication system utilizes an intermediate frequency band. Further, the S1 and S2 are the SAW filters, and the F1, F2, F3, and F4 are the FBAR filters.

(Filter Arrangement)

FIG. 18 shows a perspective view of this embodiment. This embodiment mounts the filters S1, S2, F1, F2, F3, and F4, the amplifier circuits P1, P2, and P3, and the chip elements 62 and 63 on the mounting substrate 61. In this embodiment, the FBAR filters F1, F2, F3, and F4 are arranged between the amplifier circuits P1, P2, and P3 and the SAW filters S1 and S2. This arrangement method enables arrangement of the FBAR filters F1, F2, F3, and F4 between the amplifier circuits P1/P2/P3 and the SAW filters S1/S2, and can increase the distance between the P1, P2, and P3 and the S1 and S2. Accordingly, the transfer of the heat generated from an amplifier circuit into a SAW filter can be reduced. Further, because a filter used in a communication system of a low frequency is separated from the amplifier circuit, the matching circuits mc2, mc4, and mc6 of the amplifier circuit can be formed inside the mounting substrate efficiently in the same manner as the first embodiment.

FIG. 19 is a top view of this embodiment. The matching circuits mc1, mc3, and mc5 of an antenna shared device, a part of the matching circuits mc2, mc4, and mc6 of an amplifier, and a part of the triplexer Tri are formed inside the mounting substrate 61. Multiple dielectric sheets are laminated on the mounting substrate 61. The mc1, mc2, mc3, mc4, mc5, and mc6 are formed on these dielectric sheets as strip line electrodes, and the C61, C62, C63, C64, C65, and C66 are formed as opposed flat electrodes extending over multiple dielectrics. In this embodiment, the mc1 is formed in an area 66 enclosed by a dashed line, the mc3 in an area 67 enclosed by a dashed line, and the mc5 in an area 68 enclosed by a dashed line respectively. An electrode that constitutes a triplexer is formed in an area 69 enclosed by a dashed line. Otherwise, an SP3T semiconductor switch composed of a plurality of transistors can be also mounted in the area 69 on the top of the substrate instead of the triplexer Tri. Namely, SP3T semiconductor switch is composed of a plurality of circuit utilizing transistors and an input signal is selectively outputted from any one of different three circuits by controlling a bias voltage supplied to the SP3T semiconductor switch from outside. In this case, to control the SP3T semiconductor switch, a terminal for inputting the bias voltage is formed on a substrate. Even when the communication frequencies of any one set or all of the three communication systems are close to 1,000 MHz, a satisfactory switching operation can be performed.

FIG. 20 is perspective view of this embodiment. After a filter, an amplifier circuit, and a chip element are mounted on the top of the mounting substrate 61, the SAW filters S1 and S2 and the FBAR filters F1, F2, F3, and F4 are hermetically sealed with a resin material 70a, and the amplifier circuits P1, P2, and P3 are hermetically sealed with a resin material 70b. Accordingly, each filter or amplifier circuit can be protected from being damaged by a contact or deteriorated by being exposed to the air. Further, because the amplifier and the filter are sealed with another resin material respectively, the transfer of the heat from the amplifier circuit to the SAW filter via the resin material is reduced. Consequently, the reliability of a multi-band transmitter is improved further.

Seventh Embodiment (Circuit Configuration)

Figure 21:
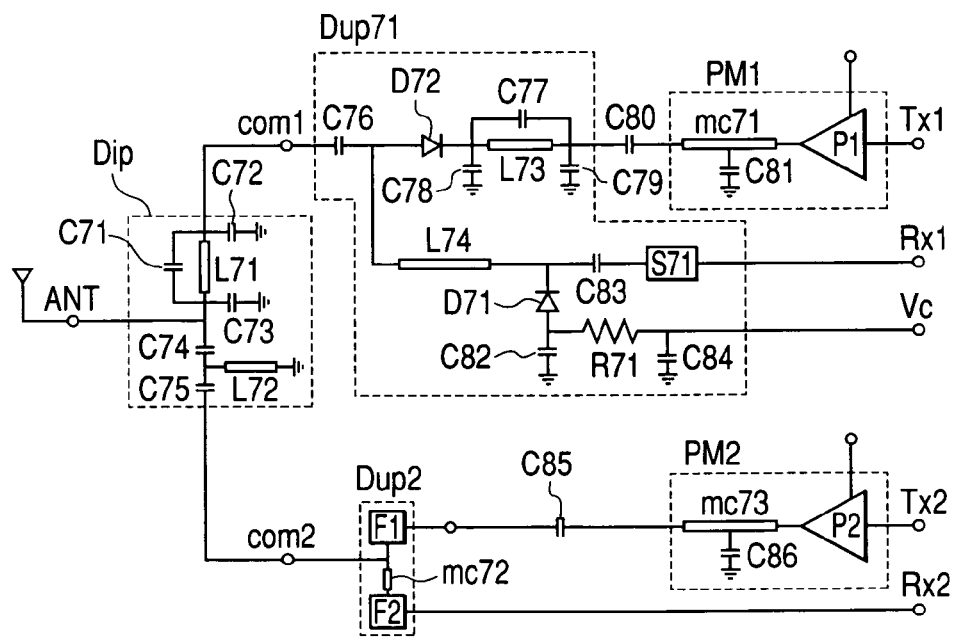
FIG. 21 is a circuit diagram of a seventh embodiment of the multi-band transceiver of the present invention.
Figure 22:
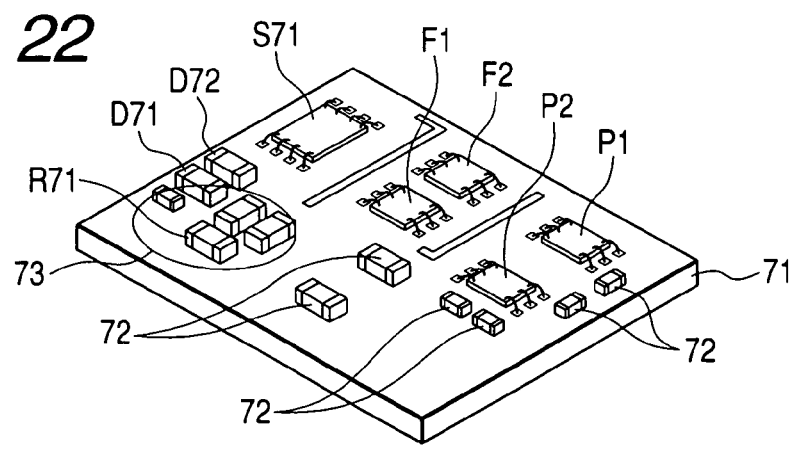
FIG. 22 is a perspective view of the multi-band transceiver of the seventh embodiment.
Figure 23:
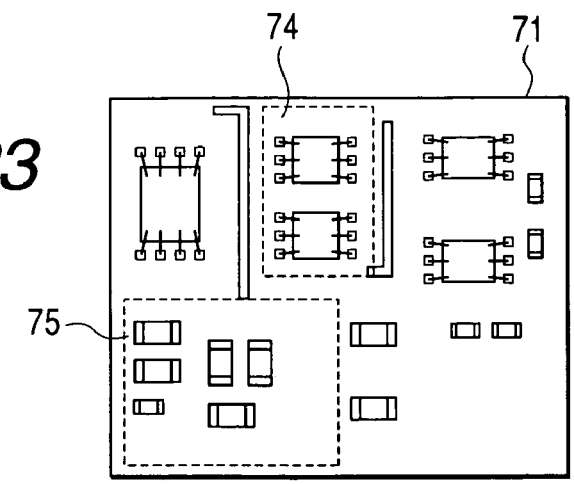
FIG. 23 is a top view of the multi-band transceiver of the seventh embodiment.
Figure 24:
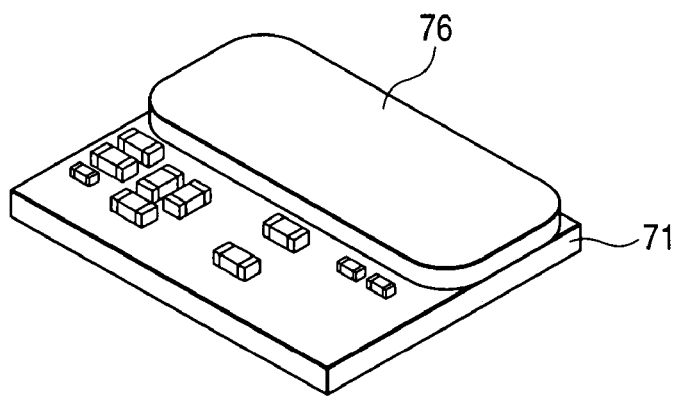
FIG. 24 is a perspective view of the multi-band transceiver of the seventh embodiment after it is sealed with the resin.

Next, a seventh embodiment according to the present invention is described with reference to FIGS. 21 to 24. FIG. 21 is a circuit diagram of a multi-band transceiver of the seventh embodiment according to the present invention, and FIG. 22 is its perspective view. FIG. 23 is a top view of this embodiment, and FIG. 24 is a perspective of this embodiment.

FIG. 21 shows a circuit diagram of this embodiment. In this embodiment, the antenna shared device of a first communication system in the first embodiment is provided with a PIN diode and a diode switch composed of a transmission line. The transmitting-end circuit of an antenna shared device Dup71 of the first communication system is provided with a PIN diode D71 and a low-pass filter composed of an inductor L73 and capacitors C77, C78, and C79. The receiving-end circuit of the Dup71 is provided with a transmission line L74, a diode D72, capacitors C82, C83, and C84, a resistor R71, a SAW filter S71, and a direct voltage terminal Vc.

When the first communication system is utilized, a positive direct current voltage is applied to the Vc. Then the PIN diodes D71 and D72 enter ON states and reach low impedance. At this occasion, the transmission line L74 resonates by the PIN diode D72 that has entered the ON state and the capacitor C82, and the impedance in which a receiving-end circuit is viewed from the connection point of the anode of the PIN diode D72, a capacitor C76, and the transmission line L74 becomes exceedingly high. As a result, the circuit between the transmitting-end circuit of the Dup71 and the transmitting signal output terminal Rx1 is intercepted, and a signal is transferred only to the transmitting-end circuit.

On the other hand, when the voltage of 0 V is applied to the direct current terminal Vc, the PIN diode enters an OFF state and reaches high impedance. As a result, the circuit between the receiving-end circuit of the Dup71 and the receiving signal input terminal Tx 1 is intercepted, and a signal is transferred only to the receiving-end circuit.

This embodiment is suitable for being used as a multi-band transceiver that corresponds to a cellular phone that uses TDMA in the first communication system.

(Filter Arrangement)

FIG. 22 shows a perspective view of this embodiment. In this embodiment, the filters S71, F1, and F2, the amplifier circuits P1 and P2, chip elements 72 and 73, the PIN diodes D71 and D72, and a resistor chip element R71R are mounted on a mounting substrate 71. In this embodiment, the FBAR filters F1 and F2 are arranged between the amplifier circuit P1 or P2 and the SAW filter S71. This arrangement method enables arrangement of the FBAR filters F1 and F2 between the amplifier circuits P1/P2 and the SAW filter S71, and can increase the distance between the P1/P2 and the S71.

Accordingly, the transfer of the heat generated from the amplifier circuit to the SAW filter is reduced further. Further, because the filter used in a communication system of a low frequency band is separated from the amplifier circuit, the matching circuits mc71 and mc73 of the amplifier circuit can be formed in the mounting substrate efficiently in the same manner as the first embodiment.

(Laminated Structure)

FIG. 23 is a top view of this embodiment. A matching circuit mc72 of an antenna shared device, the inductor L73, the transmission line L74, a part of the matching circuits mc71 and mc73, and a part of the branching filters Dips are formed inside the mounting substrate 71. Multiple dielectric sheets are laminated on the mounting substrate 71. The mc71, mc72, mc73, L73, and L74 are formed on these dielectric sheets as strip line electrodes, and capacitors C71, C72, C73, C74, C75, and C76, the capacitors C77, C78, and C79, and capacitors C81 and C86 are formed as opposed flat electrodes extending over the multiple dielectrics. In this embodiment, the mc72 is formed in an area 74 enclosed by a dashed line, and a part of the electrodes that constitutes a branching filter is formed in an area 75 enclosed by a dashed line.

(Sealed Structure)

FIG. 24 is a perspective view of this embodiment. After a filter, an amplifier circuit, and a chip element are mounted on the top of the mounting substrate 71, the SAW filter S71, the FBAR filters F1 and F2, and the amplifier circuits P1 and P2 are hermetically sealed with a resin material 76. Accordingly, the amplifier circuit can be protected from being damaged by a contact or deteriorated by being exposed to the air, and there liability of a multi-band transceiver is improved.

(Modification Example)

Figure 25:
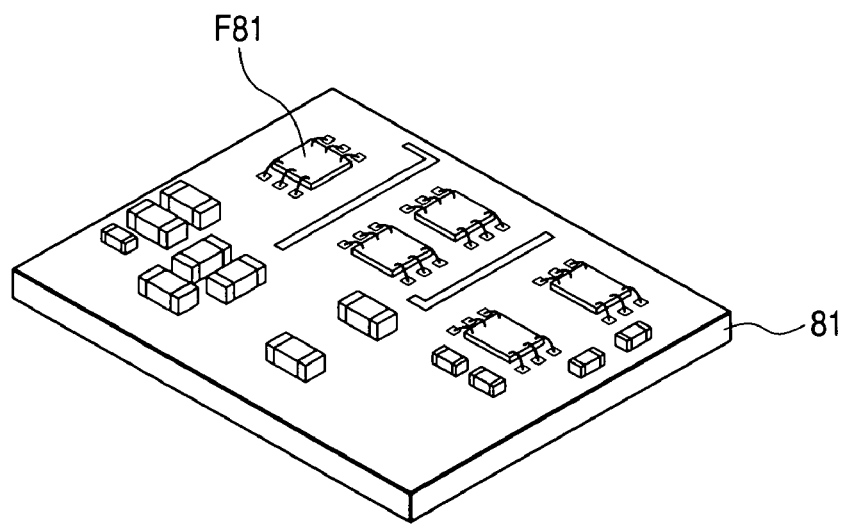
FIG. 25 is a perspective view of the modification example of the multi-band transceiver of the seventh embodiment.

FIG. 25 shows a perspective view of a modification example of the seventh embodiment. In this embodiment, a receiving filter S71 of the first communication system of the seventh embodiment is composed of an FBAR filter, and an FBAR filter F81 is mounted on the top of a mounting substrate 81. By changing all the filters mounted in this manner into FBAR filters, the damage of the filter at high output is prevented and the receiving filter of the communication system on the low frequency side at which the effect of a frequency shift on a temperature change is separated from an amplifier. Consequently, a high-reliability multi-band transceiver can be realized.

[Configuration of Mounting Substrate]

A mounting substrate of a multi-band transceiver can be formed using a low temperature calcined ceramics (LTCC) material or a resin substrate in which the low temperature simultaneous calcination of less than 950 degrees Celsius is enabled. When the substrate is formed with the LTCC, for example, a slurry type dielectric material in which powder whose main ingredients are $AL_2O_3$ and $SiO_2$ and a binder are mixed is molded into a green sheet with a doctor blade. A substrate having a sheet thickness of 40 to 200 µm was used. A penetration hole is formed at the predetermined place of the molded sheet using laser beam. Preferably, the diameter of the penetration hole should be 50 to 200 µm, and, desirably in particular, it should be 100 to 200 µm. Subsequently, a through hole is formed by filling the penetration hole with a conductor paste by screen printing. Further, for example, a silver conductor that constitutes a circuit electrode is screen-printed on sheets. The mounting substrate is constituted by laminating, crimping, and collectively calcining these screen-printed sheets. Further, plating is applied to the surface of the mounting substrate, the electrode mounted on the rear, and the ground electrode. Further, the substrate can be constituted by printing a dielectric paste and a conductor paste respectively. Further, the substrate can be laminated and integrated by printing and baking the conductor pattern on a dielectric substrate.

Here, as the sheet material of the substrate, for example, a dielectric composite containing A1, Si, Sr, and Ti of 10 to 60 mass % in the $AL_2O_3$ conversion, 25 to 60 mass % in the $SiO_2$ conversion, 7.5 to 50 mass % in the SrO conversion, and less than 20 mass % in the $TiO_2$ conversion, and Bi, Na, K, Cu, and Mn of 0.1 to 10 mass % in the $Bi_2O_3$ conversion, 0.1 to 5 mass % in the $Na_2O$ conversion, 0.1 to 5 mass % in the $K_2O$, 0.01 to 5 mass % in the CuO conversion, and 0.01 to 5 mass % in the $MnO_2$ conversion respectively. This dielectric uses a dielectric material of a relative dielectric constant of about 7. Desirably, the relative dielectric constant of the dielectric used is 7 to 100. Further, for example, if a high dielectric constant material of a dielectric constant of 100 or more is used as a dielectric sheet between electrodes that form a capacitor, the capacitor can be also formed in an exceedingly small area. A pattern electrode is formed by printing an Ag paste. Ag—Pd and Cu can also be used other than Ag.

When a mounting substrate is formed using a resin substrate, for example, a photosensitive insulating layer of an epoxy system is formed on a glass epoxy substrate in which a circuit patter is formed with a conductor, such as copper. After a through hole is formed on this photosensitive insulating layer by a photo etching method, an inner layer wiring pattern and a through hole conductor are formed by electrolytic copper plating from thereover. A mounting substrate that incorporates necessary inductors and capacitor patterns can be obtained by repeating the same process subsequently and making into multi-layered structure.

[Configuration of Communication Device]

Figure 26:
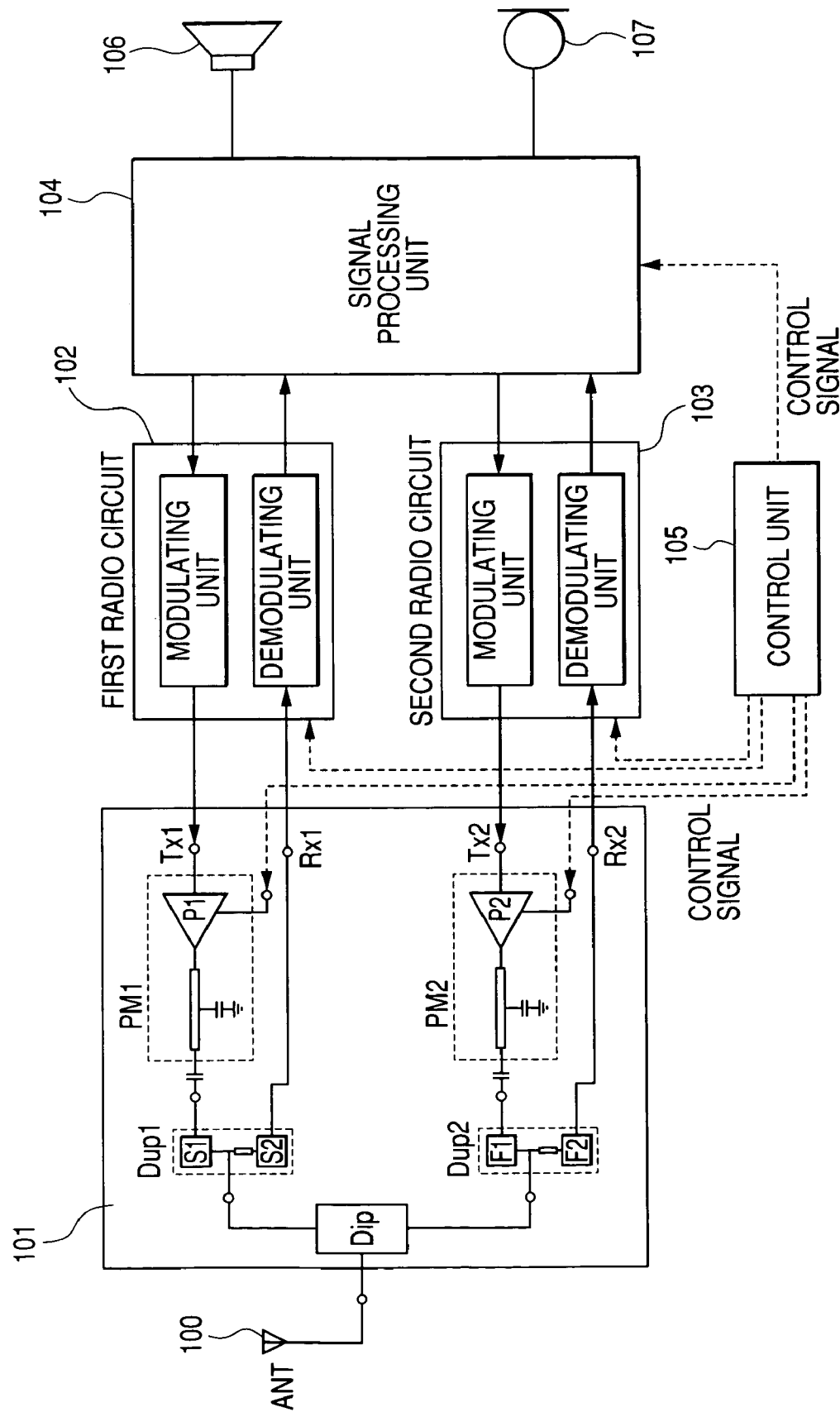
FIG. 26 is a function block diagram showing the configuration of the multi-band transceiver of an eighth embodiment.

FIG. 26 shows the configuration of a radio communication device in an eighth embodiment of the present invention. The present invention is an example in which the aforementioned multi-band transceiver is applied to the radio communication device, such as a cellular phone. First and second radio circuits 102 and 103 are connected to a multi-band transceiver 101 corresponding to a frequency band used in communication, and perform the processing of radio modulation and demodulation. A demodulation signal is converted into voice data by a signal processing unit 104 and sent from a speaker 106. Conversely, a voice input from a microphone 107 is decoded by the signal processing unit 104 and sent to a modulating unit. A control unit 105 controls the multi-band transceiver 101, the radio circuits 102 and 103, and the operation of the signal processing unit 104. For example, when the radio communication device performs communication in the frequency band that corresponds to the first radio circuit 102, the operation of the first radio circuit 102 is set on and the operation of the second radio circuit 103 is set off. Similarly, the control is performed so that the corresponding parts of the signal processing unit 104 and the multi-band transceiver 101 can be operated. By performing the control so that only the necessary parts can be operated, current consumption can be reduced and the interference between the radio circuits can be suppressed. With regard to the control on the multi-band transceiver 101, one amplifier of the relevant frequency band is set on and the other amplifier is set off. For example, on a multi-band transceiver mounted on the substrate 21 shown in FIG. 8, from the left to order, the SAW filters S1/S2 correspond to a first frequency band, the FBAR filters F1 and F2 correspond to a second frequency band, the amplifier circuit P2 correspond to the second frequency band, and the amplifier circuit P1 correspond to the first frequency band are arranged. At this occasion, when the radio communication device performs communication using the first frequency band, it is preferable that the control unit 105 sets off the amplifier circuit P2 closest to the SAW filters S1/S2 and set on the amplifier circuit P1 which is separated from SAW filters S1/S2. As having stated above, the FBAR filters F1 and F2 are excellent in a thermal characteristic in comparison with the SAW filter filters S1/S2. So that, in this arrangement, because the SAW filters S1/S2 can be made difficult to receive the effects of the heat from the amplifier circuit P1 while it is operating by making the amplifier circuit P2 in an operation off state in communication, the effects of suppressing a filter frequency shift of the SAW filters S1/S2 is improved. Still more, in FIG. 26, two frequency bands are cited as an example. Even when three or more multiple bands are applied, the filter frequency shift can be suppressed to the minimum in the same manner, while attaining miniaturization.

The present invention is not limited to the aforementioned embodiment. In the aforementioned embodiment, the communication frequency of the first communication system is specified as the low frequency side and the communication frequency of the second communication system is specified as the high frequency side. The opposite rule can also be applied. At this occasion, the low-pass and high-pas filters of a branching filter are connected reversely to the case in the aforementioned embodiment, and each filter, matching circuit, or amplifier that can be used in each communication frequency can be selected. Further, the arrangement of the filter, amplifier circuit, or chip element is based on the arrangement method according to claim 1, and any arrangement is acceptable.

In this embodiment, a chip element was used as a part of branching filters and matching circuits of amplifiers. If the space inside a mounting substrate is not used up, however, all circuits can be also formed using an electrode pattern inside the mounting substrate. At that occasion, the process in which the chip element is mounted can be saved, thereby improving the productivity of a multi-band transceiver.

In this embodiment, a wire is used to connect the electrode of the mounting substrate, the filter, and the amplifier circuit, but the flip chip connection by a metal bump can also be used.

Further, even when an amplifier that can be applicable to multiple frequency bands by one chip instead of multiple amplifiers is used, it is self evident that the effect of suppressing a filter frequency shift is suppressed to the minimum can be obtained by arranging multiple filters in close vicinity to the amplifier in order of an excellent temperature characteristic.

As described above, according to the present invention, the characteristic deterioration of a filter resulting from the heat generated from an amplifier can be prevented, and a multi-band transceiver having exceedingly high reliability can be realized. Further, a compact, low multi-band transceiver can be realized by mounting the filter and the amplifier on a mounting substrate and forming a part of frequency switching circuits, inter-filter matching circuits, and amplifier matching circuits of the amplifier inside the mounting substrate.

The invention claimed is:

1. A multi-band transceiver, comprising:
    a first shared device (Dup1) for performing transmission and reception of a first communication system;
    a second shared device (Dup2) for performing transmission and reception of a second communication system;
    a first amplifier (PM1) for amplifying a transmitted signal of the first communication system;
    a second amplifier (PM2) for amplifying a transmitted signal of the second communication system; and
    a frequency branching circuit (Dip) for branching requency bands of the first and second communication systems,
    wherein a first transmitting filter (S1) that comprises said first shared device (Dup1), a first receiving filter (S2) that forms said first shared device (Dup1), a second transmitting filter (F1) that comprises said second shared device (Dup2), a second receiving filter (F2) that forms said second shared device (Dup2), said first amplifier (PM1), and said second amplifier (PM2) are mounted on the same substrate, and
    wherein the distance between said first transmitting filter (S1)/first receiving filter (S2) and a first amplifier circuit (P1)/second amplifier circuit (P2) is made larger than the distance between said second transmitting filter (F1)/second receiving filter (F2) and said first amplifier circuit (P1)/second amplifier circuit (P2).

2. A multi-band transceiver, comprising:
    a first shared device (Dup1) for performing transmission and reception of a first communication system;
    a second shared device (Dup2) for performing transmission and reception of a second communication system;
    a first amplifier (PM1) for amplifying a transmitted signal of the first communication system;
    a second amplifier (PM2) for amplifying a transmitted signal of the second communication system; and
    a frequency switching circuit (Dip) for switching frequency bands of the first and second communication systems,
    wherein a first transmitting filter (S1) that comprises said first shared devIce (Dup1), a first receiving filter (S2) that forms said first shared device (Dup1), a second transmitting filter (F1) that comprises said second shared device (Dup2), a second receiving device that forms said second shared device (Dup2), said first amplifier (PM1), and said second amplifier (PM2) are mounted on the same substrate, and
    wherein the distance between said first transmitting filter (S1)/first receiving filter (S2) and first amplifier circuit (P1)/second amplifier circuit (P2) is made larger than the distance between said second transmitting filter (F1)/second receiving filter (F2) and said first amplifier circuit (P1)/second amplifier circuit (P2), and
    said second transmitting filter (F1)/second receiving filter (F2) are arranged between said first transmitting filter (S1)/first receiving filter (S2) and said first amplifier circuit (P1)/second amplifier circuit (P2).

3. A multi-band transceiver comprising a function of sharing transmitted and received signals of a plurality of frequency bands by the same antenna,
    wherein a plurality of filters that correspond to said plurality of frequency bands and an amplifier group containing a plurality of amplifiers for amplifying a transmitted signal are mounted on the same substrate, and said plurality of filters are arranged in close vicinity to said amplifier group in order of an excellent temperature characteristic,
    wherein each of said plurality of filters is formed in a different process, and includes a different temperature characteristic, and
    wherein a filter located farther from said amplifier group corresponds to a communication system of a lower frequency within said plurality of frequency bands.

4. A multi-band transceiver according to claim 3, wherein a matching circuit for obtaining the matching between a transmitting filter and a receiving filter that correspond to each frequency band, at least a part of the matching circuits of said amplifier, and at least a part of frequency branching circuits for branching the frequency bands are arranged on the surface or inside of said substrate.

5. A multi-band transceiver according to claim 3, wherein an electrode pattern leading to a ground electrode via a through hole between said amplifier and said closely arranged filter and/or between said closely arranged filter and another filter is formed on a dielectric layer that constitutes said substrate.

6. A multi-band transceiver according to claim 3, wherein a recessed part for housing at least one of said transmitting filter, said receiving filter, and said amplifier is provided at least either the surface or rear of said substrate.

7. A multi-band transceiver according to claim 3, wherein said substrate is formed with either a ceramics or resin substrate.

8. A multi-band transceiver according to claim 3, wherein the material of said ceramics contains $Al_2O_3$ and $SiO_2$.

9. A multi-band transceiver according to claim 3, wherein said substrate is a composite material of resin and ceramics.

10. A radio communication device having a transmission and reception function in a plurality of frequency bands,
    wherein a multi-band transceiver according to claim 3 is arranged between an antenna and a plurality of high frequency circuits that correspond to said plurality of frequency bands,
    the radio communication device comprising a control unit that controls said high frequency circuit and operation conditions of said multi-band transceiver in accordance with a frequency band used in communication.

11. A radio communication device having a transmission and reception function in a plurality of frequency bands,
    wherein a multi-band transceiver according to claim 3 is arranged between an antenna and a plurality of high frequency circuits that correspond to said plurality of frequency bands,
    wherein a filter group containing a plurality of filters that correspond to said plurality of frequency bands and an amplifier group containing a plurality of amplifiers for amplifying a transmitted signal are separately mounted on the same substrate,
    each of said plurality of filters in said filter group is arranged in close vicinity to said amplifier group in order of an excellent temperature characteristic, and, at the same time, at least another amplifier operates in another frequency band is arranged between a first filter arranged in closest vicinity to said amplifier group and an amplifier that operates in a frequency band that corresponds to said first filter,
    wherein a second filter located farther from said amplifier group corresponds to a communication system of a lower frequency within said plurality of frequency bands, and
    the radio communication device comprising a control unit that controls said high frequency circuit and operation conditions of said multi-band transceiver in accordance with a frequency band used in communication, wherein when the radio communication device performs communication in a frequency hand that corresponds to said first filter arranged in closest vicinity to said amplifiers, said control unit controls the processing so that the amplifier operates in a frequency band in closest vicinity other than said amplifier operates in another frequency band arranged in closest vicinity to said first filter arranged most closely can operate.

12. A multi-band transceiver comprising a function of sharing transmitted and received signals of plurality of frequency bands by the same antenna,
wherein a filter group containing a plurality of filters that correspond to said plurality of frequency bands and an amplifier group containing a plurality of amplifiers for amplifying a transmitted signal are separately mounted on the same substrate,
each of said plurality of filters in said filter group is arranged in close vicinity to said amplifier group in order of an excellent temperature characteristic, and, at the same time, at least another amplifier operating in another frequency band is arranged between a filter arranged in closest vicinity to said amplifier group and an amplifier that operates in a frequency band that corresponds to this filter, and
wherein a filter located farther from said amplifier group corresponds to a communication system of a lower frequency within said plurality of frequency bands.

13. A multi-band transceiver according to claim 12, wherein a matching circuit for obtaining the matching between a transmitting filter and a receiving filter that correspond to each frequency band, at least a part of the matching circuits of said amplifier, and at least a part of frequency branching circuits for branching the frequency bands are arranged on the surface or inside of said substrate.

14. A multi-band transceiver according to claim 12, wherein an electrode pattern leading to a ground electrode via a through hole between said amplifier and said closely arranged filter and/or between said closely arranged filter and another filter is formed on a dielectric layer that constitutes said substrate.

15. A multi-band transceiver according to claim 12, wherein a recessed part for housing at least one of said transmitting filter, said receiving filter, and said amplifier is provided at least either the surface or rear of said substrate.

16. A multi-band transceiver according to claim 12, wherein said substrate is formed with either a ceramics or resin substrate.

17. A multi-band transceiver according to claim 12, wherein the material of said ceramics contains $Al_2O_3$ and $SiO_2$.

18. A multi-band transceiver according to claim 12, wherein said substrate is a composite material of resin and ceramics.

19. A radio communication device having a transmission and reception function in a plurality of frequency bands,
wherein a multi-band transceiver according to claim 12 is arranged between an antenna and a plurality of high frequency circuits that correspond to said plurality of frequency bands,
the radio communication device comprising a control unit that controls said high frequency circuit and operation conditions of said multi-band transceiver in accordance with a frequency band used in communication.

20. A radio communication device having a transmission and reception function in a plurality of frequency bands,
wherein a multi-band transceiver according to claim 12 is arranged between an antenna and a plurality of high frequency circuits that correspond to said plurality of frequency bands,
wherein a filter group containing a plurality of filters that correspond to said plurality of frequency bands and an amplifier group containing a plurality of amplifiers for amplifying a transmitted signal are separately mounted on the same substrate,
each of said plurality of filters in said filter group is arranged in close vicinity to said amplifier group in order of an excellent temperature characteristic, and, at the same time, at least another amplifier operates in another frequency band is arranged between a first filter arranged in closest vicinity to said amplifier group and an amplifier that operates in a frequency band that corresponds to said first filter,
wherein a second filter located farther from said amplifier group corresponds to a communication system of a lower frequency within said plurality of frequency bands, and
the radio communication device comprising a control unit that controls said high frequency circuit and operation conditions of said multi-band transceiver in accordance with a frequency band used in communication,
wherein when the radio communication device performs communication in a frequency band that corresponds to said first filter arranged in closest vicinity to said amplifiers, said control unit controls the processing so that the amplifier operates in a frequency band in closest vicinity other than said amplifier operates in another frequency band arranged in closest vicinity to said first filter arranged most closely can operate.

* * * * *